United States Patent
Min et al.

(10) Patent No.: US 8,319,283 B2
(45) Date of Patent: Nov. 27, 2012

(54) LATERALLY DIFFUSED METAL OXIDE SEMICONDUCTOR (LDMOS) DEVICE WITH MULTIPLE GATES AND DOPED REGIONS

(75) Inventors: Won Gi Min, Chandler, AZ (US); John L. Huber, Gilbert, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 107 days.

(21) Appl. No.: 12/475,232

(22) Filed: May 29, 2009

(65) Prior Publication Data

US 2010/0301403 A1    Dec. 2, 2010

(51) Int. Cl.
*H01L 29/66* (2006.01)
*H01L 21/336* (2006.01)

(52) U.S. Cl. ............... 257/343; 257/344; 257/E29.256; 438/266

(58) Field of Classification Search .............. 257/343
See application file for complete search history.

(56) References Cited

U.S. PATENT DOCUMENTS

| | | | |
|---|---|---|---|
| 6,110,804 A * | 8/2000 | Parthasarathy et al. | 438/454 |
| 6,413,806 B1 | 7/2002 | Sicard et al. | |
| 7,033,891 B2 * | 4/2006 | Wilson et al. | 438/270 |
| 2004/0251492 A1 | 12/2004 | Lin | |
| 2005/0067655 A1 * | 3/2005 | Shibib et al. | 257/344 |
| 2005/0082610 A1 | 4/2005 | Shibib et al. | |
| 2005/0090049 A1 | 4/2005 | Abadeer et al. | |
| 2007/0187724 A1 * | 8/2007 | Kaufmann et al. | 257/239 |
| 2008/0067587 A1 * | 3/2008 | Gossner et al. | 257/336 |
| 2008/0121997 A1 | 5/2008 | Yang | |

* cited by examiner

*Primary Examiner* — Matthew Landau
*Assistant Examiner* — Khaja Ahmad
(74) *Attorney, Agent, or Firm* — Charles Bergere

(57) ABSTRACT

A semiconductor device includes a source region within a semiconductor substrate, a drain region within the semiconductor substrate, a control gate over the semiconductor substrate and between the source region and the drain region, a first gate between the control gate and the drain region, and a first doped region within the semiconductor region and between the control gate and the first gate. The method of forming the semiconductor device may include depositing an electrode material over the semiconductor substrate, patterning the electrode material to form a control gate and a first gate, implanting a first doped region within the semiconductor substrate between the control gate and the first gate while using the control gate and the first gate as a mask, and implanting a source region within the semiconductor substrate.

13 Claims, 3 Drawing Sheets

US 8,319,283 B2

LATERALLY DIFFUSED METAL OXIDE SEMICONDUCTOR (LDMOS) DEVICE WITH MULTIPLE GATES AND DOPED REGIONS

BACKGROUND

1. Field

This disclosure relates generally to semiconductor devices, and more specifically, to laterally diffused metal oxide semiconductor (LDMOS) devices.

2. Related Art

Laterally diffused metal oxide semiconductor (LDMOS) devices are often used as power switches in power management or radio frequency (RF) integrated circuits. In general, LDMOS field effect transistors operate under high voltages (e.g., greater than or equal to 20 Volts), conduct high current of up to tens of Amps while in the on-state, and can be manufacturing using complementary metal oxide semiconductor (CMOS) processes used to manufacture logic devices.

One conventional LDMOS field effect transistor has a lightly doped layer formed near the edge of the gate electrode and coupled to the drain. This lightly doped layer reduces electric field at the edge of the gate, thus creating a high breakdown voltage while in the off-state and decreasing hot carrier injection (HCI) while in the on-state. However, it is undesirable to use conventional LDMOS field effect transistors with an active drift region in power management applications, because of its low breakdown voltage for operation at 20 Volts or greater. While in the off-state, a portion of drain voltage extends under the gate edge and over the thin gate oxide. Usually these thin gate oxides of deep submicron integrated circuits cannot sustain drain voltage of 20V or greater. Hence, the device cannot meet long term reliability requirements when operating at that high voltages. As a result, the device's rated operation voltage becomes significantly lower.

This problem can be mitigated by extending the gate over a field oxide (e.g., a shallow trench isolation), which is thicker than the gate oxide underlying the gate. However, the field oxide is in the middle of the on-state current path and thus, blocks on-state current flow and causes high on-state resistance. In addition, the field oxide can create high leakage due to a mechanical stress near the substrate and field oxide interface.

Hence, a need exists for an LDMOS device that can be used in analog applications and does not have the disadvantages of the prior art.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a semiconductor device, such as an LDMOS device, operates at a high voltage (e.g., greater than approximately 20 Volts) and has multiple gates, some of which may be floating, and self-aligned lightly doped regions between at least two of the gates. The gates may serve as masks during the implant process that may be used to form doped regions between the gates and within the semiconductor substrate. The doped regions may serve as voltage dividers that uniformly distribute the drain voltage in the drift layer during off-state. The gates other than the control gate are floating or coupled to the drift region. One advantage is that processing variation of the dosage and energy used to form the doped regions between floating gates are unlikely to cause breakdown voltage variation. Another advantage is that the doped regions shield the edge of the gates, especially the control electrode from high electric field, thereby minimizing HCI problems.

Figure 1:
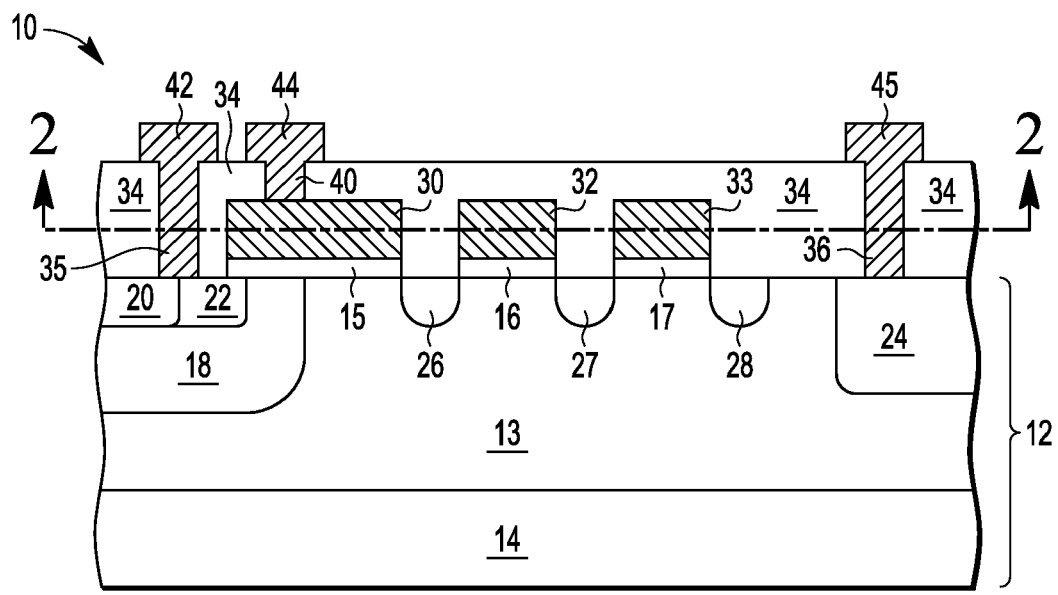
FIG. 1 illustrates a cross-section of a portion of a semiconductor device in accordance with an embodiment.

FIG. 1 illustrates a cross-section of a semiconductor device 10, such as an LDMOS device. The semiconductor device 10 includes a semiconductor substrate 12. The semiconductor substrate 12 can be any semiconductor material or combinations of materials, such as gallium arsenide, silicon germanium, silicon-on-insulator (SOI), silicon, monocrystalline silicon, the like, and combinations of the above. The semiconductor substrate 12, in one embodiment, is a silicon substrate 12 that has been doped p-type and hence has a p-type region 14. Ion implantation may be used to form an n-type drift region 13 in the semiconductor substrate, wherein the n-type drift region 13 may be bounded by isolation regions (not illustrated). The drift region 13 may be formed within the semiconductor substrate to a depth less than the entire depth of the semiconductor substrate 12 so that the p-type region 14 remains at the bottom of the semiconductor substrate. Depending on whether other devices and the type of devices that are being formed, a mask may be used to prevent the n-type drift region 13 from being formed in the entire semiconductor substrate 12 (i.e., in areas not illustrated where other devices may be formed.) Next a mask may be used to form a p-type region 18 within the n-type drift region 13.

Next, a gate dielectric is formed over the semiconductor substrate 12. The gate dielectric can be any suitable dielectric, such as silicon dioxide or a high dielectric constant material (e.g., hafnium oxide). The gate dielectric may be deposited (e.g., using chemical vapor deposition (CVD), atomic layer deposition (ALD), or the like) or thermally grown. After forming the gate dielectric, a gate electrode material is deposited (e.g., CVD, PVD, or the like) over the gate dielectric. The gate electrode material may be any suitable conductive material, such as polysilicon or a material including a metal. The electrode material and in the embodiment illustrated, the gate dielectric are then patterned using a mask, such as photoresist, and an etch, such as a reactive ion etch, to form at least two gates and underlying gate dielectrics. In the embodiment illustrated in FIG. 1, the gate electrode material is patterned to form a first gate 30, which is a main gate also referred to as a control electrode, a second gate 32, and a third gate 33. The first gate 30 is over a first gate dielectric 15, the second gate 32 is over a second gate dielectric 16, and the third gate 33 is over a third gate dielectric 17. The first gate 30, the second gate 32 and the third gate 33 automatically be formed at the same time and made of the same material. The distance between each of the gates 30, 32, 33, may be determined by the minimum space defined in the design rules being used for a predetermined technology node. FIG. 1 illustrates three gates; however any plurality of gates may be present, such as two, three, four, etc. In the embodiment illustrated in FIG. 1, the first gate 30 is laterally adjacent the second gate 32, which is laterally adjacent the third gate 33. Hence, there are no intervening gates between the first gate 30 and the second gate 32 and the second gate 32 and the third gate 33, although there can be other elements (e.g., a dielectric) between each pair of gates.

After forming the gates 30, 32, and 33, doped regions 26-28 may be formed between each of the gates 30, 32, and 33 and within the semiconductor substrate. The doped regions are doped less than the source the doped regions 20, 22, or 24. Hence, the doped regions 26-28 have a concentration of dopants that is less than that of the doped regions 20, 22, or 24. In one embodiment, the doped regions 26-28 are formed using the gates 30, 32, and 33 as masks during ion implantation. For example, the doped regions 26-28 are p-type doped regions are formed by implanting boron at a dosage of approximately 1e12 atoms/cm2 to approximately 5e13 astoms/cm2. The implant can be an LDD implant in the given semiconductor process. Any number of doped regions 26-28 may be present, such as one, two, etc. The drain voltage that is needed for operation is affected by the number of doped regions 26-28. More specifically, the drain voltage is divided by the number of doped regions 26-28. Thus, in the embodiment illustrated in FIG. 1 with three doped regions 26-28, the drain voltage is decreased by ⅓ or divided by three. Therefore, the drain voltage is desirably uniformly distributed and the breakdown voltage of the semiconductor device 10 is improved. The first doped region 26 between the main gate 30 and the floating gate 32 may block the on-state current and cause high Rdson. Hence, the p-type region 26 can be blocked using photoresist while the doped regions 27 and 28 are implanted self aligned to the gates 32 and 33. If the presence of the doped region 28 causes early breakdown, which may occur if the doped region 28 and drain doped region 24 are too close, the doped region 28 may not be formed. Hence, in one embodiment, the doped region 28 can be blocked using photoresist during the implant. Additional masks may then be used to form a p-type region 20 and an n-type region 22 within the p-type region 18. The n-type region 22 in the embodiment illustrated in FIG. 1 is the source region of the semiconductor device 10. In addition, a n-type region 24 may be formed simultaneously with the n-type region 22. The n-type region 24 in the embodiment illustrated in FIG. 1 is the drain region of the semiconductor device.

After forming the source and drain regions 26-28, an interlayer dielectric (ILD) layer 34, which may be any suitable dielectric such as silicon dioxide or low dielectric constant material, may deposited (e.g., by CVD, PVD, or the like). The ILD layer 34 electrically isolates each of the gates 30, 32, and 33 from each other. The ILD layer 34 can be formed by deposition (e.g., by CVD, PVD, or the like). Contacts 35, 40, and 36 may be formed by performing photolithography and etching to form contact openings or holes and filling the contact openings. The contact openings can be filled with a conductive material, such as tungsten. The conductive material can be formed by a deposition process, such as CVD, PVD, or the like. In addition, the conductive material may include different materials. After forming the contacts 35, 40, and 36, conductive material is deposited and patterned to form conductive regions 42, 44, and 45. In one embodiment, the conductive regions 42, 44, and 45 are the first metal layer in the semiconductor process.

In the embodiment illustrated in FIG. 1, the second gate 32 and the third gate 33 are floating gates. During off-state, the drain voltage is uniformly distributed along drift region and fraction of drain voltage is drop under the main gate 30 edge. This will enhance the reliability of gate oxide 15 under the main gate, and enhance breakdown voltage of the LDMOS. Even if the extra gates are floating, the gates 32 and 33 are coupled by inter dielectric capacitance of the ILD layer 34 to main gate. Also the gates 32 and 33 are coupled to drain through gate oxide 16 and 17. The coupling capacitance between gates divides the drain voltage. In a given technology, the gate length and space are most fine geometry. Using the floating gates as a implant mask, it is possible to form very narrow and closely packed p region 26, 27, and 28 to reduce drift region length.

While FIG. 1 illustrates three doped regions 26-28 any number of doped regions may be present. For example, only even if all the gates 30, 32, and 33 are present, doped region 26 or doped region 28 may not be present. An advantage of having more doped regions 26-28 is that the more doped regions 26-28 that are present, the more the breakdown voltage increases.

Figure 2:
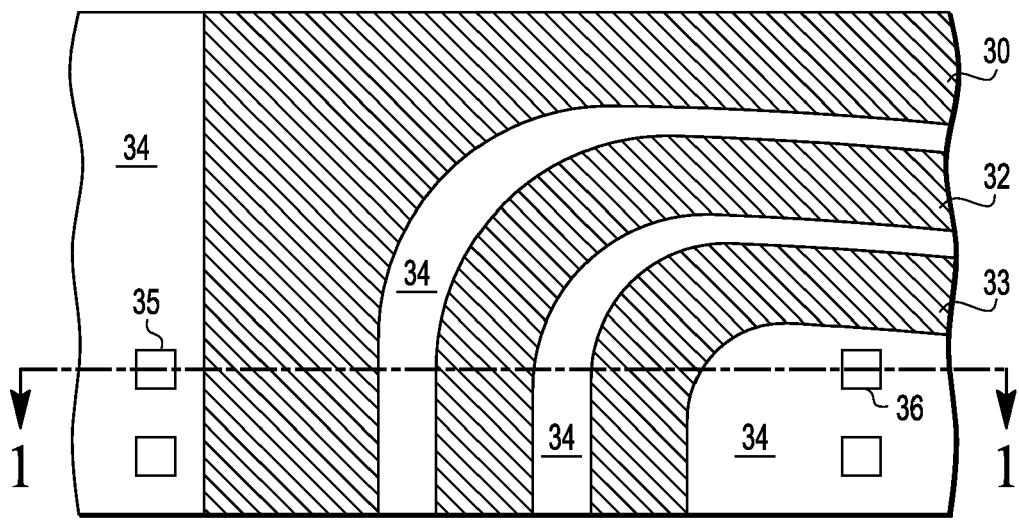
FIG. 2 illustrates a top-down view of a portion of FIG. 1 in accordance with an embodiment.

FIG. 2 illustrates a top down view of FIG. 1 in accordance with an embodiment. The top down view is taken at the line in FIG. 1 as if the portion above the line in FIG. 1 was not present. FIG. 2 illustrates one layout example of the devices of FIG. 1. In this embodiment, the gates 30, 32 and 34 are parallel to each other and from a top-down view are curved in a race-track pattern between contacts 35 and 36. A skilled artisan can appreciate that other layout examples exist. Although four contacts (e.g., 35, 36) are illustrated, a skilled artisan recognizes that additional contacts may be present. In addition, a skilled artisan can appreciate that various different patterns can be used to block or open for ion implant for lightly doped region between gates.

Without a field oxide which blocks on-state current, the current path is wider in the drift region for the LDMOS device in at least one embodiment. For the same on-state current, the drift region of the LDMOS in this embodiment has less current density compared to the LDMOS device with the field oxide. This decreases the Kirk effect during high voltage and high gate bias conditions. In addition, the effective base region is away from heavily doped drain region. Since the lightly doped drift region is buffered between the base and drain region and the electric field in this region is reduce by uniform distribution of drain voltage during on-state, the impact ionization in the junction is mitigated and the device can allow higher on-state current before snap back, which limits the device operation, happens. For this reason, the safe operating area (SOA) of the LDMOS device in the embodiments described is higher compared to that of the LDMOS device with the field oxide.

Figure 3:
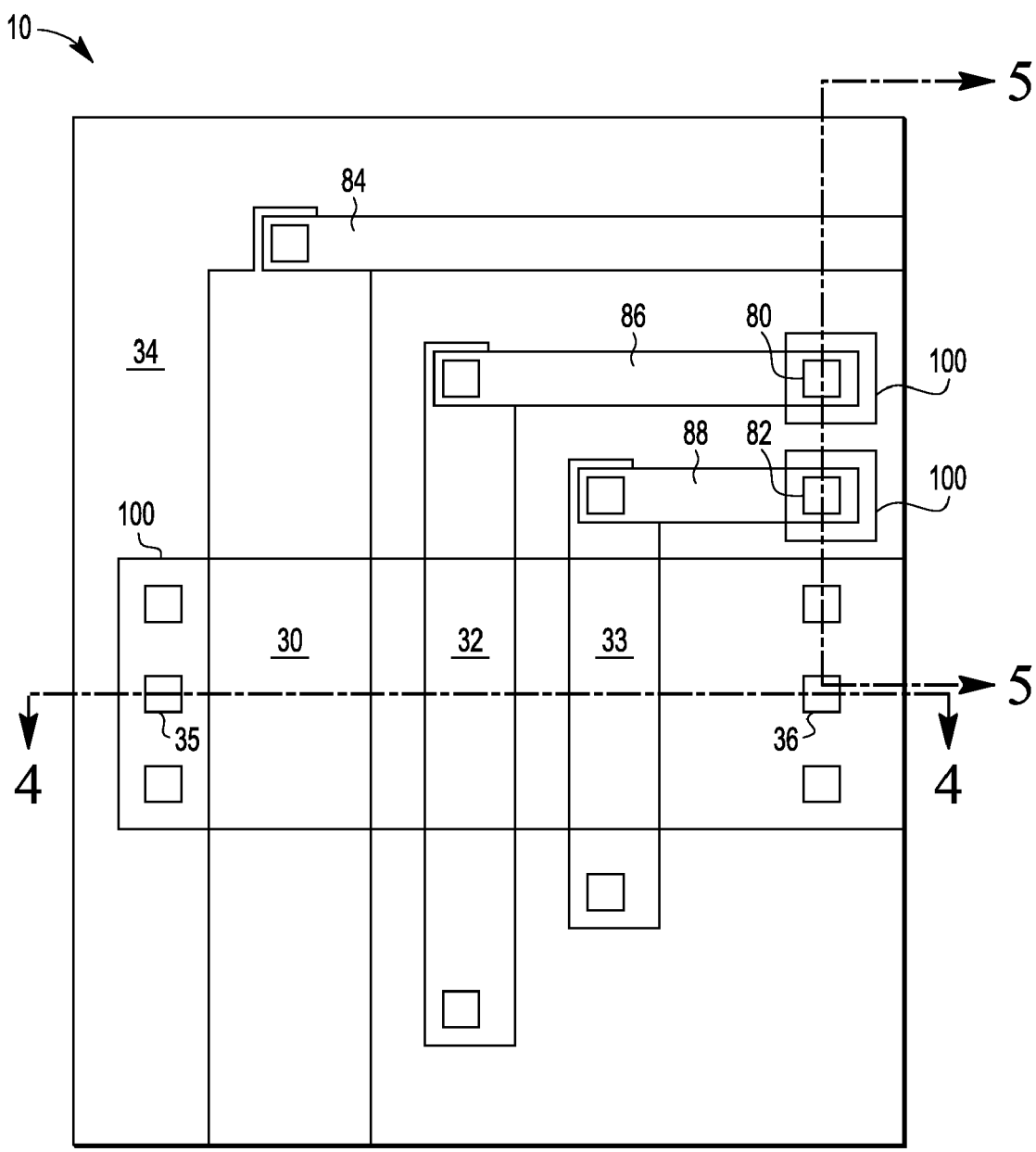
FIG. 3 illustrates a top-down view of a portion of a semiconductor device in accordance with an embodiment.

FIG. 3 illustrates a top-down view of a portion of the semiconductor device 10 in accordance with an embodiment. FIG. 3 illustrates one layout example; a skilled artisan appreciates that other layouts may be used. In this embodiment, the gates 30, 32 and 34 are straight and parallel to each other between contacts 35 and 36. The gates 30, 32, and 34 are each coupled to a metal layers or conductive regions 84, 86, and 88, respectively. A skilled artisan can appreciate that any number of vias may be present. FIG. 3 also illustrates contacts 80 and 82 that are in line with and hence, adjacent to, contact 36. The contacts 80 and 82 are within the active region 100, The boxes 100 denote the active area, which is where the current is confined.

Figure 4:
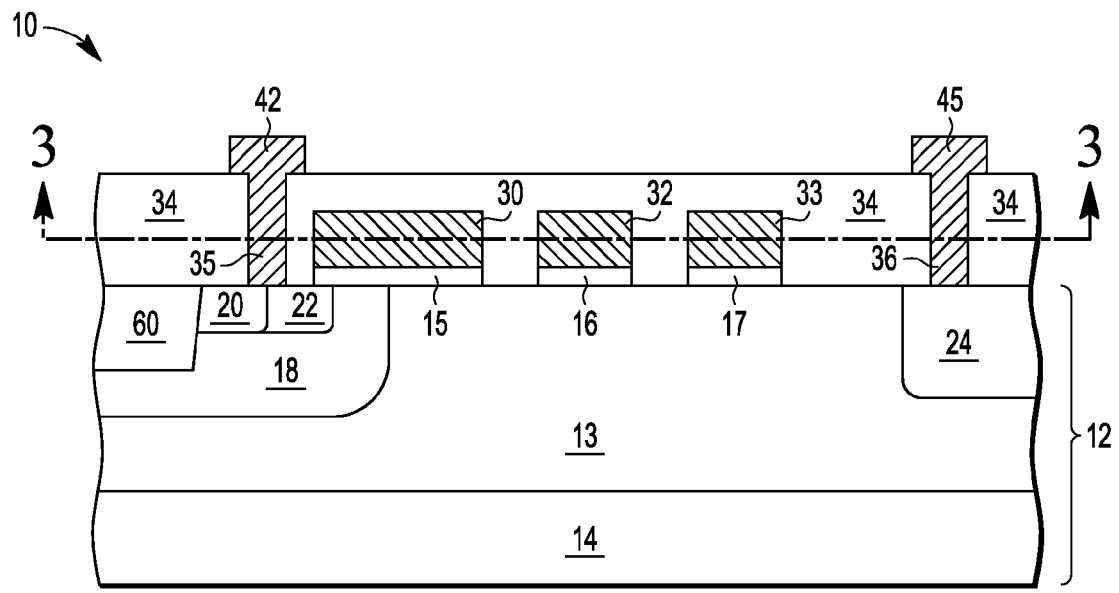
FIG. 4 illustrates a cross-section of a portion of FIG. 3 in accordance with an embodiment.

FIG. 4 illustrates a cross-section an embodiment in FIG. 3 where the gates 32 and 33 are not floating and instead are coupled to the drift region 13. Unlike the embodiment illustrated in FIG. 1, in the embodiment illustrated in FIG. 4, the second gate 32 and the third gate 33 are coupled to the drift region. Hence, the second gate 32 and the third gate 33 are not floating. In this embodiment, the potential on gate 32 and 33 can be controlled by the location of the coupling on the drift region. For example, the second gate 32 is tied to the drift region close to the base doping 18 and the potential on the second gate 32 is close to ground potential. In this arrangement, the gate 32 behaves as a shielding gate to protect the main gate 30 from gate oxide damage that can occur in the off-state and HCI (hot carrier injection) damage that can occur in the on-state.

Figure 5:
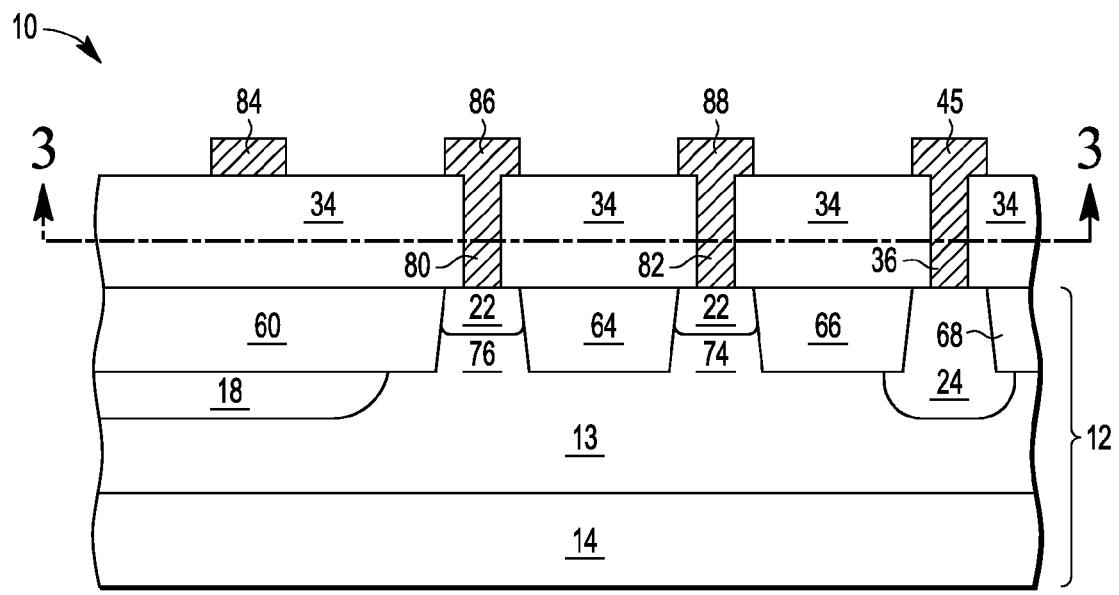
FIG. 5 illustrates a cross-section of a different portion of FIG. 3 in accordance with an embodiment.

FIG. 5 illustrates a cross-section of the contacts of FIG. 3 where the n-type region 22 forms an ohmic contact between the plug, which includes contact 80 and conductive region 86, which like all other conductive regions herein may be part of a conductive or metal line, and the n-drift region 13. Conductive region 84 is coupled to the first gate 30 in a portion of the semiconductor device that is not shown in FIG. 5. Conductive region 86 is coupled to the second gate 32 in a portion of the semiconductor device that is not shown in FIG. 5. Similarly, conductive region 88, which is coupled to contact 82 and the n-type region 22, is coupled to the third gate 33 in a portion of the semiconductor device that is not shown in FIG. 5. Shallow trench isolation or other isolation regions 60, 64, 66, and 68 electrically isolate the two illustrate n-type region 22 from each other and the n-type region 2 from the drain 24.

In one embodiment, a method of forming a semiconductor device includes depositing an electrode material over the semiconductor substrate; patterning the electrode material to form a control gate and a first gate; implanting a first doped region within the semiconductor substrate between the control gate and the first gate while using the control gate and the first gate as a mask, wherein the first doped region has a first dopant concentration and a first polarity; implanting a source region within the semiconductor substrate, wherein the source region has a second dopant concentration and a second polarity, wherein the second dopant concentration is greater than the first dopant concentration and the second polarity is different than the first polarity; and implanting a drain region within the semiconductor substrate, wherein the drain region has the second polarity. In one embodiment, the first polarity is p-type and the second polarity is n-type. In one embodiment, patterning the electrode material further includes pattering a third gate latterly adjacent the first gate. In one embodiment, the method further includes implanting a second doped region within the semiconductor substrate between the first gate and the second gate while using the first gate and the second gate as a mask, wherein the second doped region has the first dopant concentration and the first polarity. In one embodiment, implanting the first doped region is performed while implanting the second doped region.

By now it should be appreciated that there has been provided a semiconductor device, which may be an LDMOS device, that has a breakdown voltage that is less sensitive to doping variation and that can be manipulated by the number of gates and doped regions between the gates. In addition, the device has minimal or no electric field or current crowding near the proximately of the gate dielectric and substrate, which results in minimal or no HCI problems. In addition, on-state resistance is improved. Furthermore, the device can be manufactured using CMOS process.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention. Although the invention has been described with respect to specific conductivity types or polarity of potentials, skilled artisans appreciated that conductivity types and polarities of potentials may be reversed.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A laterally diffused metal oxide semiconductor (LDMOS) device, comprising:
    a semiconductor substrate including a n-type drift region;
    a first gate over the semiconductor substrate and the n-type drift region, wherein the first gate is a control electrode;
    a second gate over the semiconductor substrate and the n-type drift region and laterally adjacent the first gate;
    a first doped region between and adjacent to the first gate and the second gate and that extends into the n-type drift region, wherein the first doped region is a p-doped region that shields edges of the first and second gates from high electric fields;
    a source region within the semiconductor substrate; and
    a drain region within the semiconductor substrate, wherein:
        the first gate, the second gate, and the first doped region are between the source region and the drain region; and
        the first doped region is doped less than the source region or the drain region, and wherein the first doped region acts as a voltage divider to distribute drain voltage in the semiconductor substrate during an off-state.

2. The LDMOS device of claim 1, further comprising:
    a third gate over the semiconductor substrate and laterally adjacent the second gate so that the second gate is between the first gate and the third gate; and
    a second doped region within the semiconductor substrate and between the second gate and the third gate and wherein the first and second doped regions act as a voltage divider to distribute drain voltage in the semiconductor substrate during an off-state.

3. The LDMOS device of claim 1, wherein the first gate is coupled to the drain region.

4. The LDMOS device of claim 1, wherein the second gate is coupled to the drain region.

5. The LDMOS device of claim 2, wherein the second gate and the third gate are coupled to the drain region.

6. The LDMOS device of claim 2, wherein:
the third gate is between the drain region and the second gate; and
the second doped region is doped less than the source region or the drain region.

7. The LDMOS device of claim 1, wherein the second gate is floating.

8. The LDMOS device of claim 2, wherein the second and third gates are floating.

9. The LDMOS device of claim 1, further comprising a dielectric layer located between the first gate and the semiconductor substrate, and between the second gate and the semiconductor substrate.

10. The LDMOS device of claim 1, wherein the first gate and the second gate have top surfaces that are coplanar with each other.

11. The LDMOS device of claim 1, wherein the first gate, the second gate, and the third gate have top surfaces that are coplanar with each other.

12. The LDMOS device of claim 1, wherein:
the first doped region is doped with a first polarity;
the source region is doped with a second polarity, wherein the first polarity and the second polarity are different; and
the drain region is doped with the second polarity.

13. A method of forming a laterally diffuse metal oxide semiconductor (LDMOS) device, the method comprising:
providing a semiconductor substrate including a n-type drift region overlying a p-type region;
depositing an electrode material over the n-type drift region;
patterning the electrode material to form a control gate and a first gate adjacent to the control gate;
implanting a first doped region within the n-type drift region between the control gate and the first gate while using the control gate and the first gate as a mask, wherein the first doped region has a first dopant concentration and a first polarity, and wherein the first doped region abuts the control gate and the first gate;
implanting a source region within the n-type drift region, wherein the source region has a second dopant concentration and a second polarity, wherein the second dopant concentration is greater than the first dopant concentration and the second polarity is different than the first polarity; and
implanting a drain region within the n-type drift region, wherein the drain region has the second polarity, and wherein the first polarity is p-type and the second polarity is n-type.

* * * * *